(12) United States Patent
Bois et al.

(10) Patent No.: US 7,687,760 B2
(45) Date of Patent: Mar. 30, 2010

(54) AMORPHOUS OPTICAL COUPLING STRUCTURE FOR AN ELECTROMAGNETIC WAVE DETECTOR AND ASSOCIATED DETECTOR

(75) Inventors: Philippe Bois, Cesson (FR); Nadia Briere De L'Isle, Limours (FR); Eric Costard, Massy (FR); Alfredo De Rossi, Paris (FR)

(73) Assignee: Thales (FR)

( * ) Notice: Subject to any disclaimer, the term of this patent is extended or adjusted under 35 U.S.C. 154(b) by 445 days.

(21) Appl. No.: 10/558,247

(22) PCT Filed: May 26, 2004

(86) PCT No.: PCT/EP2004/050929

§ 371 (c)(1),
(2), (4) Date: Nov. 23, 2005

(87) PCT Pub. No.: WO2004/107392

PCT Pub. Date: Dec. 9, 2004

(65) Prior Publication Data

US 2006/0243892 A1    Nov. 2, 2006

(30) Foreign Application Priority Data

May 27, 2003  (FR)  .................... 03 06431

(51) Int. Cl.
*H01L 31/00* (2006.01)
(52) U.S. Cl. .................... 250/214.1; 257/21
(58) Field of Classification Search ............ 250/214.1, 250/338.1, 208.1, 339.02, 338.4, 339.05, 250/237 R, 226, 216; 257/440, 21, 443, 257/431, 432, 441, 442
See application file for complete search history.

(56) References Cited

U.S. PATENT DOCUMENTS 4,505,022 A   3/1985  Briere
4,586,239 A   5/1986  Briere (Continued)

FOREIGN PATENT DOCUMENTS

EP   0 508 970 A   10/1992

(Continued)

OTHER PUBLICATIONS

Lee C P et al: "Quantum Well Infrared Photodetectors with Bi-Periodic Grating Couplers" Applied Physics Letters, American Institute of Physics, New York, US vol. 61, No. 20 Nov. 16, 1992 pp. 2437-2439.

(Continued)

*Primary Examiner*—Que T Le
*Assistant Examiner*—Jennifer Bennett
(74) *Attorney, Agent, or Firm*—Lowe Hauptman Ham & Berner, LLP

(57) ABSTRACT

The invention relates to an optical coupling structure intended to couple electromagnetic radiation to the surface of a photodetector, wherein a coupling surface paved along mutually perpendicular first and second directions by a set of N series (M1i, M2i, . . . . Mni) of first features, second features, . . . nth features, the features being identical within any one series, the features being distributed along the first and second directions, the distance between the centers of two adjacent features or the inter-reticular distances between two adjacent features being variable. The subject of the invention is also a detector or a laser source comprising said coupling structure.

21 Claims, 5 Drawing Sheets

U.S. PATENT DOCUMENTS

| | | | |
|---|---|---|---|
| 5,086,327 | A | 2/1992 | Rosencher |
| 5,138,407 | A | 8/1992 | Hirtz |
| 5,187,715 | A | 2/1993 | Welsbuch |
| 5,228,777 | A | 7/1993 | Rosencher |
| 5,326,984 | A | 7/1994 | Rosencher |
| 5,485,015 | A * | 1/1996 | Choi .......................... 257/21 |
| 5,506,418 | A | 4/1996 | Bois et al. |
| 5,539,206 | A * | 7/1996 | Schimert ................. 250/338.4 |
| 5,677,544 | A | 10/1997 | Duboz |
| 5,712,499 | A | 1/1998 | Duboz |
| 5,719,670 | A | 2/1998 | Duboz |
| 5,726,500 | A | 3/1998 | Duboz |
| 5,869,844 | A | 2/1999 | Rosencher |
| 6,091,126 | A | 7/2000 | Costard |
| 6,157,020 | A | 12/2000 | Krapf |
| 6,180,990 | B1 * | 1/2001 | Claiborne et al. ........... 257/440 |
| 6,534,758 | B2 | 3/2003 | Costard |
| 6,569,704 | B1 * | 5/2003 | Takeuchi et al. .............. 438/94 |
| 6,627,868 | B2 | 9/2003 | Bois |
| 6,797,938 | B2 * | 9/2004 | Bois et al. ................... 250/225 |
| 6,809,350 | B1 | 10/2004 | Berger |
| 7,135,698 | B2 * | 11/2006 | Mitra .......................... 257/21 |
| 2002/0008191 | A1 * | 1/2002 | Faska et al. ............... 250/208.1 |
| 2002/0148963 | A1 * | 10/2002 | Claiborne et al. ........ 250/338.1 |
| 2004/0108564 | A1 * | 6/2004 | Mitra .......................... 257/442 |
| 2005/0249473 | A1 | 11/2005 | Page |

FOREIGN PATENT DOCUMENTS

| | | |
|---|---|---|
| EP | 0 866 504 A | 9/1998 |
| FR | 2 783 356 A | 3/2000 |

OTHER PUBLICATIONS

Patent Abstract of Japan vol. 2000 No. 13, Feb. 5, 2001 JP 2000 299488A Oct. 24, 2000.

Andersson J Y et al: "Coupling of Radiation Into Quantum Well Infrared Detectors by the use of Reflection Gratings and Waveguide Structures" Intersubband Transitions in Quantum Wells. Sep. 9-14, 1991. Proceeding of the Advanced Research Workshop on intersubband Transitions in Quantum Wells, New York Sep. 9, 1991, pp. 1-13.

Yeong-Cheng Wang et al "A numerical analysis of the double periodic reflection metal grating for multiquantum well infrared photodectors" Journal of Applied Physics, American Institute of Physics, New York vol. 74, No. 4 Aug. 15, 1993.

* cited by examiner

US 7,687,760 B2

AMORPHOUS OPTICAL COUPLING STRUCTURE FOR AN ELECTROMAGNETIC WAVE DETECTOR AND ASSOCIATED DETECTOR

FIELD OF THE INVENTION

The field of the invention is that of electromagnetic wave detectors made of semiconductor material and especially one having a multiple quantum well structure, particularly one suitable for the infrared range.

BACKGROUND OF THE INVENTION

The rapid advances made in epitaxial growth on GaAs-type substrates has led to the development of a new class of electromagnetic wave detectors using the absorption of radiation around a wavelength $\lambda$ corresponding to the electron transition between various energy levels within one and the same band or between the valence band and the conduction band. The diagram shown in FIG. 1 illustrates this type of transition.

The recent evolution in performance of this type of component is due in particular to the relatively easy production of semiconductor heterojunction multilayers in the standard system by MBE (molecular beam epitaxy), that is to say the $GaAs/Ga_{(1-x)}Al_xAs$. By adjusting the growth parameters, the thickness of the quantum wells and the percentage x of aluminum in the barriers imposing the confinement potential, it is possible to choose a narrow detection band (about 1 micron) centered on a given wavelength.

This type of structure has the advantage of providing very good sensitivity because of the discretization of the energy levels within the conduction bands of the photoconductor materials used.

Within the context of intersubband transitions, so that this type of transition is possible, it is necessary for the electric field of the incident electromagnetic wave to have a component along the direction of growth of the layers, i.e. along the direction D indicated in FIG. 1, this direction being perpendicular to the plane of the layers.

It has already been proposed to use coupling means of the diffraction grating type (cf. Goossen and Lyon, APL (1985), pp 1257-1259) for generating said perpendicular component, creating diffracted rays, especially lamellar (1D) gratings or steps for coupling only a single polarization of the light. However, crossed diffraction gratings are also known for coupling the various electric field components of an incident ray, such as the laser source LS as illustrated in FIG. 2. The matrix grating Rij diffracts the incident ray along both the direction Dx and the direction Dy.

The major drawback of the use of gratings is the wavelength and angular resonance associated with the increase in absorption, thereby limiting the use of these devices to a very narrow absorption window. These resonances are directly related to the periodic nature of the gratings. Thus, if it is desired to have a detector capable of detecting a range of wavelengths having a broader spectral band, solutions other than grating structures have to be sought.

SUMMARY OF THE INVENTION

This is why the present invention proposes a novel amorphous optical coupling structure designed to couple electromagnetic radiation on the surface of a photodetector, in order to eliminate the periodic effects while still ensuring effective optical coupling.

This is a structure in which a short-range order may be defined, which appears in the Fourier components at spatial frequencies corresponding to the wavelengths at which the detector intended to use this coupling structure is sensitive, but without being able to define a long-range order corresponding to a periodic structure.

More precisely, the subject of the present invention is an optical coupling structure intended to couple electromagnetic radiation to the surface of a photodetector, characterized in that it comprises a coupling surface paved along mutually perpendicular first and second directions by a set of N series of first features, second features, . . . nth features, the features being identical within any one series, the features being distributed along the first and second directions, the centers between two adjacent features or the inter-reticular distance between two adjacent features being variable and the first, second, . . . nth features being of square shape and/or of rectangular shape.

Advantageously, the density of features on the coupling surface is approximately constant over the entire said surface.

Advantageously, the optical coupling surface consists of a set of N series of first, second, . . . nth identical elementary cells within the same series constituting the paving, each first, second, . . . nth elementary cell comprising a feature homothetic with said elementary cell.

Advantageously, the average of the distances between the centers of adjacent features or the average of the inter-reticular distances between two adjacent features along the first direction and the average along the second direction are substantially equal to the wavelength of the electromagnetic radiation in the detector medium.

According to a first embodiment of the invention, the inter-reticular space between the features is constant.

According to a second embodiment of the invention, each feature is centered within an elementary cell, the inter-reticular distance between features not being constant and the fill factor of the elementary cells by the features being constant.

Typically, the coupling surface may comprise first, second, third and fourth features having dimensions of axa, bxb, axb and bxa, respectively.

The features may be equally well etched level with the coupling surface as produced on the surface of the coupling surface by conventional photolithography processes and they typically have an etch depth of around $\lambda/4$.

According to one embodiment of the invention, the paving may be obtained by depositing a highly conductive layer of the gold or silver type.

The subject of the invention is also an electromagnetic wave detector comprising a multiple quantum well structure operating on interband or intersubband transitions by absorption of radiation around a wavelength $\lambda$, and comprising optical coupling means for coupling said radiation, characterized in that the optical coupling means comprise an optical coupling structure as claimed in the invention.

In general, the object of the invention is to reinforce the electromagnetic field in the form of optical modes within the active layer and therefore the invention can be applied to intersubband or interband transitions.

Advantageously, the detector may comprise a multilayer stack produced on the surface of a substrate, said stack comprising the multiple quantum well structure and external layers, the first and second features being etched within one external layer.

The subject of the invention is also a matrix electromagnetic wave detector, characterized in that it comprises a matrix of individual detector elements as claimed in the invention, each individual detector element having a multilayer stack, said stack comprising the multiple quantum well structure and external layers, the first and second features being etched within one external layer, said elements being produced on the surface of a common substrate.

According to one embodiment of the invention, the stack of active layers is a stack of semiconductor layers of the doped GaAs or GaAlAs type, the substrate being of the doped or undoped GaAs type.

According to one embodiment of the invention, the detector may comprise a substrate that is transparent at the wavelength of the radiation and a layer that is reflective at said wavelength, said reflective layer being on the surface of the features, so as to make the detector operate in reflection.

Finally, the subject of the invention is a laser source comprising a multiple quantum well structure operating on interband or intersubband transitions at a wavelength $\lambda$ and comprising an optical coupling structure according to the invention.

BRIEF DESCRIPTION OF THE DRAWINGS

The invention will be more clearly understood and other advantages will become apparent on reading the description that follows and thanks to the appended figures among which.

In general, the coupling structure according to the invention comprises a set of paved features on a coupling surface, these features being distributed in two orthogonal directions Dx and Dy, the density of features over the entire surface being substantially constant.

To produce an amorphous coupling structure it is necessary to distribute the features in an aperiodic manner. To produce this condition, we will describe below various nonexhaustive alternatives that allow the desired objective to be achieved.

DETAILED DESCRIPTION OF THE EMBODIMENT

First Embodiment

Figure 1:
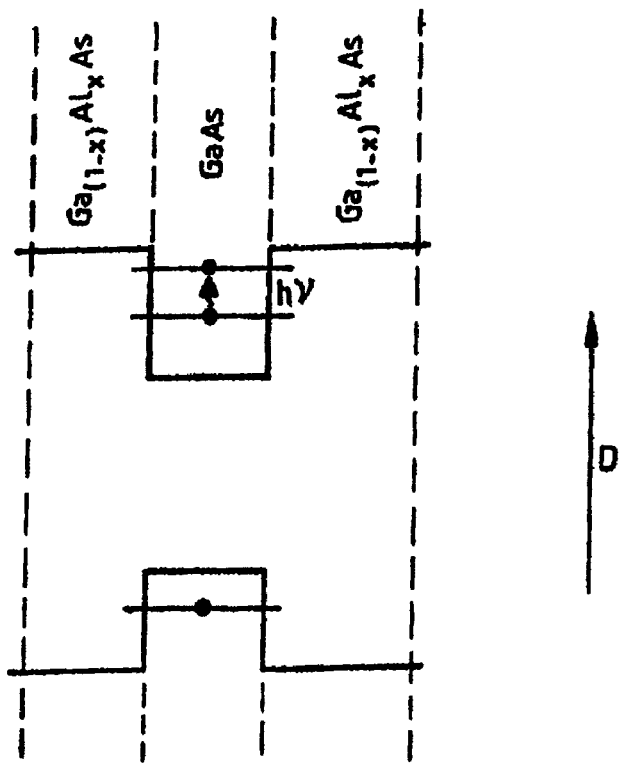
FIG. 1 shows schematically a multiple quantum well structure according to the known art.
Figure 2:
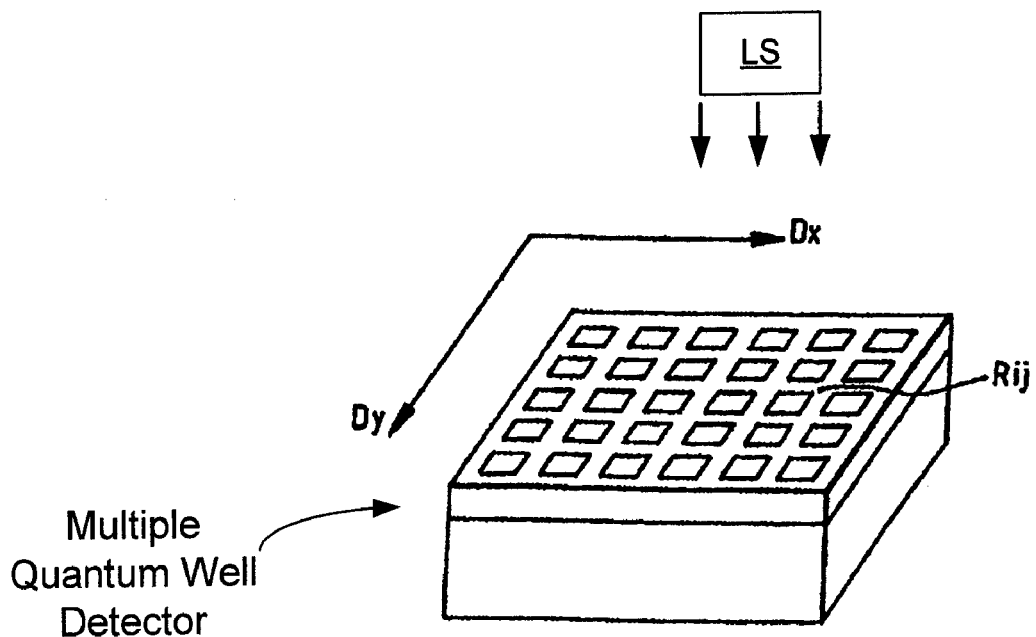
FIG. 2 illustrates a laser source and multiple quantum well detector possessing optical coupling means of the matrix diffraction grating type, according to the prior art.
Figure 3:
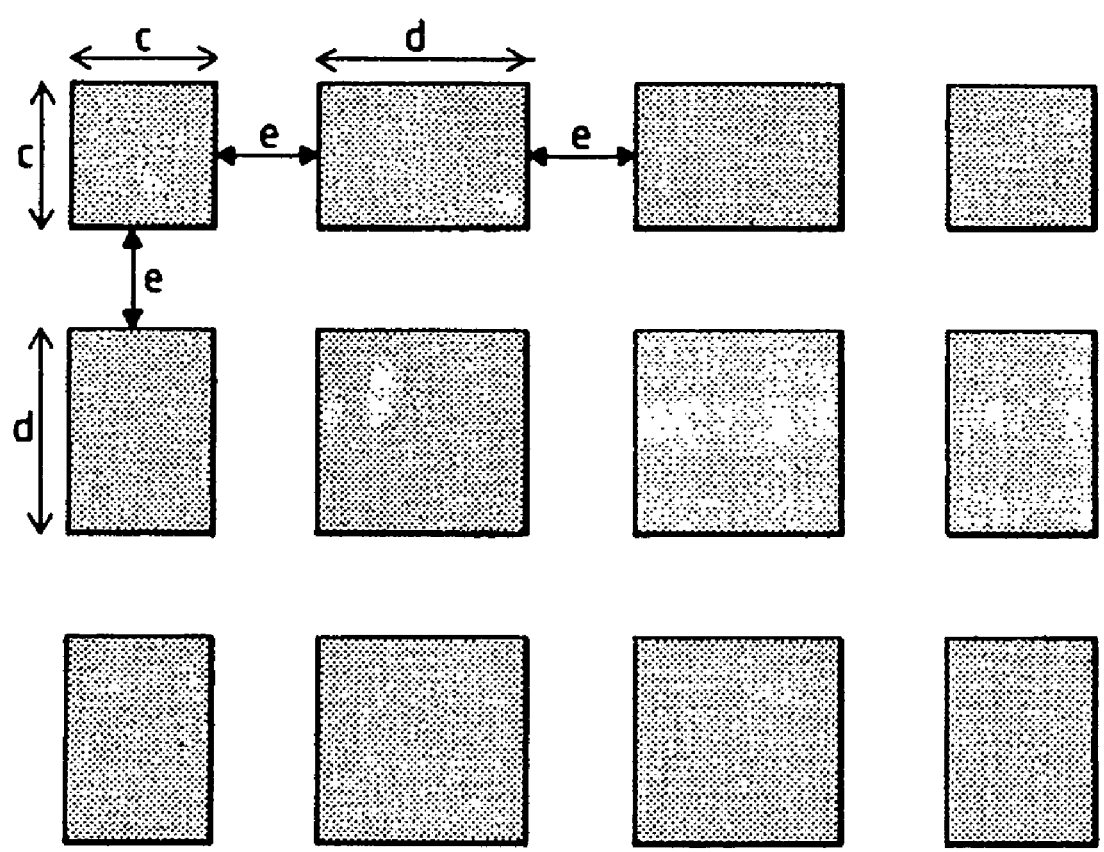
FIG. 3 illustrates a first embodiment of an optical coupling structure according to the invention.

The coupling surface is made up of four series of elementary features, two series of square features having dimensions of c×c, d×d and two series of rectangular features having dimensions of c×d and d×c, as illustrated in FIG. 3. The distance between features is constant and equal to e.

The length c+e is matched to a first wavelength $\lambda_1$ and the length d+e is matched to a second wavelength $\lambda_2$ so as to obtain an effective coupling structure over a certain spectral band, that is to say $c+e \approx \lambda_1/n$ and $d+e \approx \lambda_2/n$, where n is the optical index of the detector medium.

Second Embodiment

Figure 4:
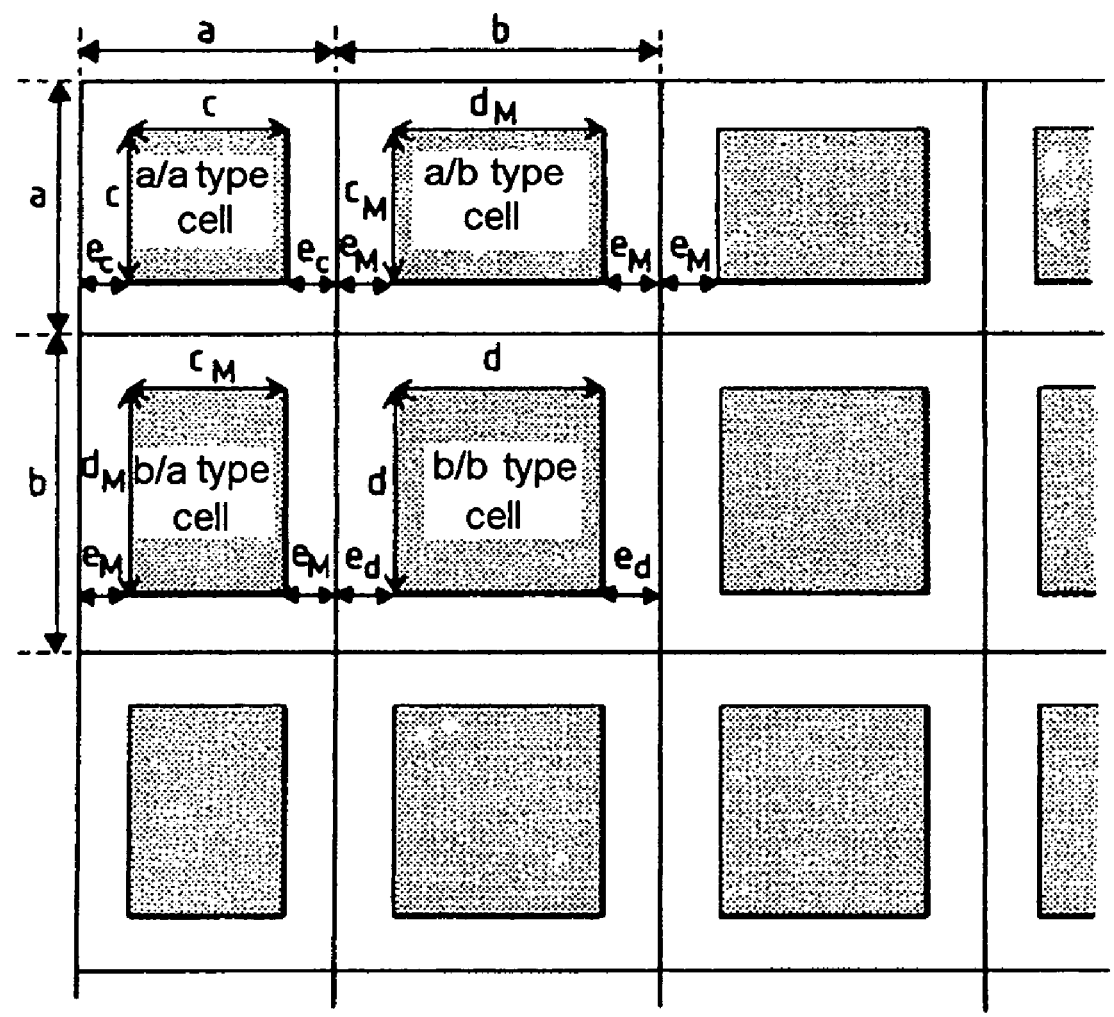
FIG. 4 illustrates a second embodiment of an optical coupling structure according to the invention.

The optical coupling surface is defined in terms of elementary surfaces, again called elementary cells having dimensions of a×a, a×b, b×a and b×b, as illustrated in FIG. 4. In this embodiment, four series of features (M1i, M2i, M3i and M4i) homothetic with said elementary cells are employed. The features have dimensions of c×c, $c_M \times d_M$, $d_m \times c_M$ and d×d, respectively. The dimensions $c_M$ and $d_M$ are determined so as to maintain the same fill factor as for the a×a and b×b cells.

The length a is matched to a first wavelength $\lambda_1$ and the length b is matched to a second wavelength $\lambda_2$ so as to obtain an effective coupling structure over a certain spectral band. For each type of cell, the feature is placed at the center of the cell, the spacing between each feature ($e_c+e_M$, $e_M+e_d$, $e_d+e_d$, etc.) being variable within the structure.

Third Embodiment

Figure 5:
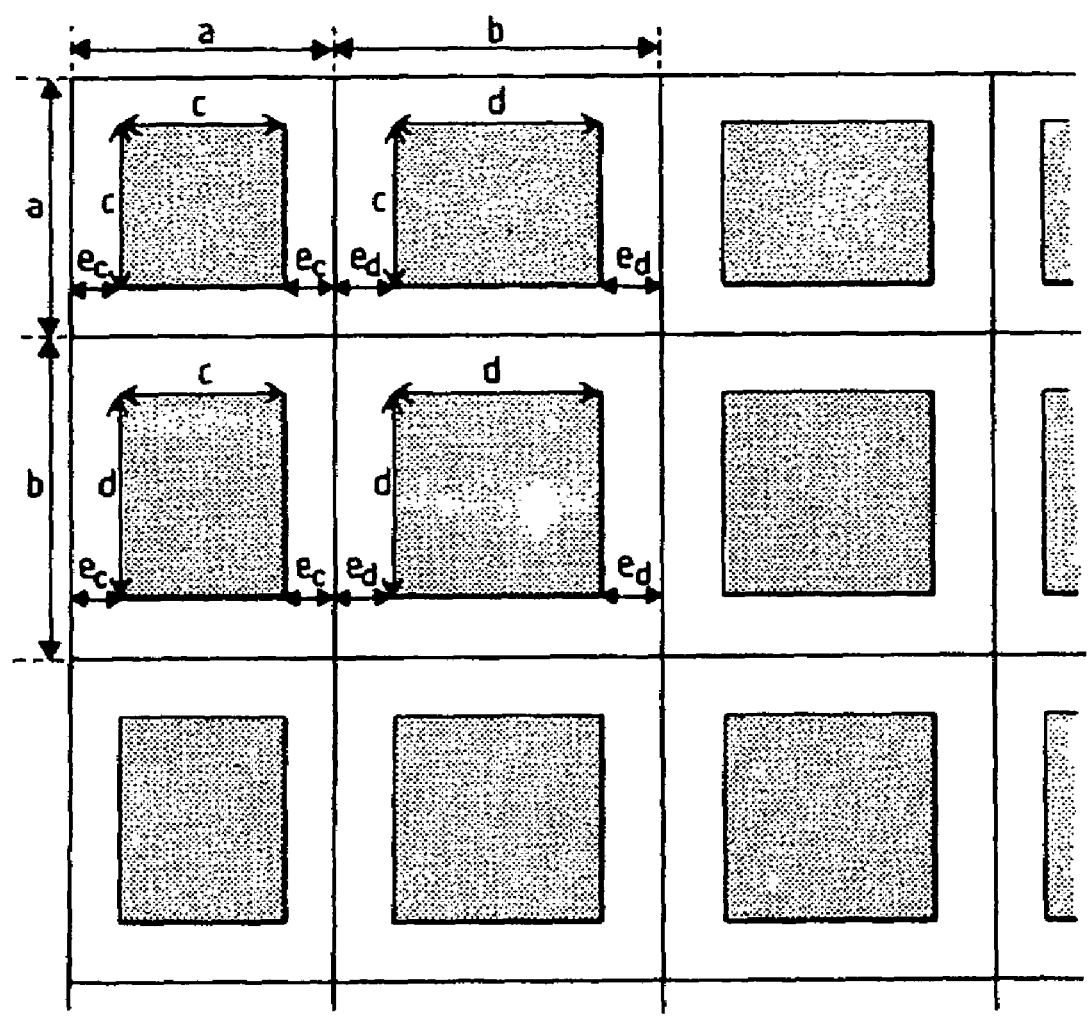
FIG. 5 illustrates a third embodiment of an optical coupling structure according to the invention.

The optical coupling surface is defined in terms of elementary surfaces again called elementary cells having dimensions of a×a, a×b, b×a and b×b, as illustrated in FIG. 5.

In this embodiment, four series of features (M1i, M2i, M3i and M4i) homothetic with said elementary cells are employed. The features have dimensions of c×c, c×d, d×c and d×d, respectively.

The length c is matched to a first wavelength $\lambda_1$ and the length d is matched to a second wavelength $\lambda_2$ so as to obtain an effective coupling structure over a certain spectral band.

The fill factor is not the same between the square cells and the rectangular cells.

In general, the optical structure according to the invention may comprise etched features (the preferred embodiment as technologically this is the easiest to produce).

Figure 6:
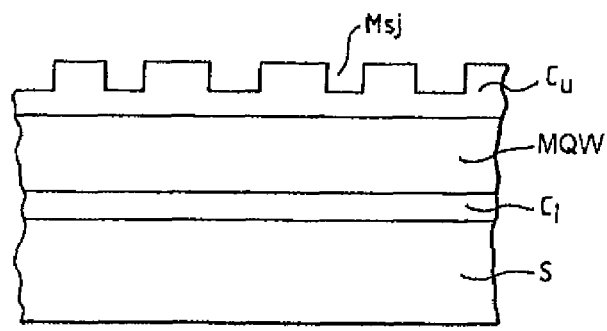
FIG. 6 illustrates an example of a multiple quantum well detector according to the invention, seen in cross section.

The detector may be conventionally produced on the surface of a substrate S made of a possibly undoped semiconductor material. An assembly of layers constituting an ohmic contact, called the lower contact $C_1$ made of highly doped semiconductor material is deposited on the surface of the substrate. This ohmic contact supports the set of semiconductor layers constituting the multiple quantum well structure MQW, this structure being in contact with an assembly of layers constituting an ohmic contact called the upper contact $C_u$, the detection taking place between the two ohmic contact layers. Advantageously, the features may be etched in the ohmic contact layer $C_u$ as illustrated in FIG. 6, which shows a cross-sectional view.

The above description has shown optical coupling configurations for an elementary detector that may advantageously be applied within the context of a matrix detector comprising individual elements, each of these individual elements having, on the surface, optical coupling means comprising diffraction features along the directions Dx and Dy.

Figure 7:
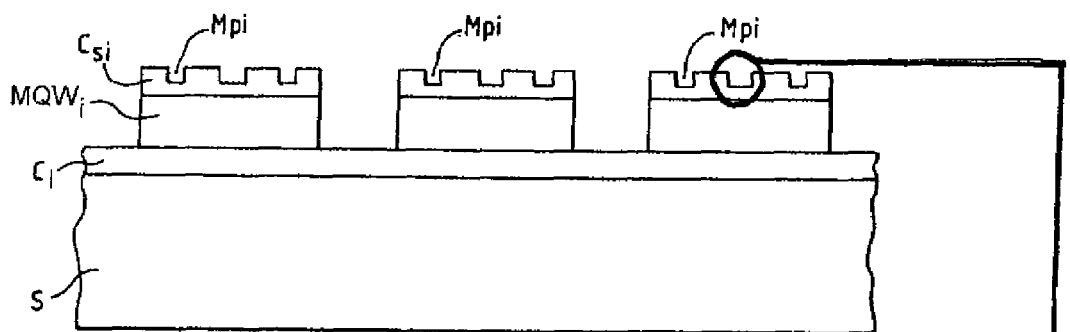
FIG. 7 illustrates an example of a matrix detector according to the invention.
Figure 8:
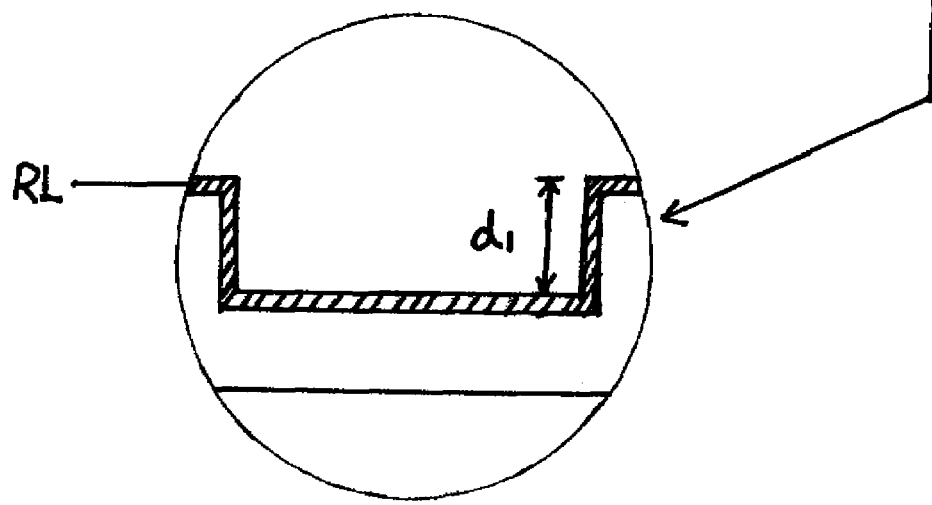
FIG. 8 illustrates an exploded view of a matrix detector according to the invention.

FIGS. 7 and 8 illustrate an example of a matrix detector according to the invention in which the set of features is produced on the surface of a common substrate with an ohmic contact layer that is also common.

To produce this architecture, the procedure is as follows:

a first ohmic contact layer $C_1$ is produced on a substrate that is transparent to the wavelengths at which the detector is sensitive, said ohmic contact layer $C_1$ also being transparent;

a stack of layers constituting the multiple quantum well structure is produced on this ohmic contact layer;

the second ohmic contact layer $C_u$ is deposited;
the features are etched in the layer $C_u$;
the etched portions have a thickness $d_1$, which is around $\lambda/4$;
the individual detection elements are defined by etching all of the layers down to the surface of the lower contact layer $C_1$;
a reflective layer RL is deposited over the second ohmic contact layer $C_u$; and
advantageously, an encapsulation layer may be deposited on the matrix detector thus obtained.

Embodiment Example

We will now describe an example of a detector according to the invention that operates in the infrared range, and more particularly one suitable for the 8-12 micron range.

The lower ohmic contact layer made of Si-doped GaAs with a doping content of $5\times10^{18}$ cm$^{-3}$ and a thickness of typically 2 microns is deposited on an intrinsically undoped GaAs substrate.

The multiple quantum well structure is produced by the stacking of 50 periods composed of an Si-doped GaAs layer with a charge carrier concentration of $5\times10^{18}$ cm$^{-3}$ with a thickness of 5 nm, this being inserted between two barrier layers consisting of $Ga_{0.75}Al_{0.25}As$ with a thickness of 50 nm.

The upper contact layer is identical to the lower contact layer and also has a thickness of 2 microns.

The features of the amorphous coupling feature are produced within this upper contact layer.

To obtain the desired diffracting effects at an operating wavelength around 9 microns, the etch depths are 1.2 microns and the spacings a and b of the features are 2.4 microns and 2.7 microns (the mean optical index of the structure being from 3.3 to 9 microns). The fill factor of the surface of the upper contact layer is typically around 50%.

The invention claimed is:

1. An optical coupling structure intended to couple electromagnetic radiation to the surface of a photodetector, comprising:
   an ohmic contact layer having an optical coupling surface comprising a set of N series of first, second, . . . nth identical elementary cells within the same series, each first, second, . . . nth elementary cell, wherein for each type cell, a raised feature is formed at the center of the cell and extends outward therefrom, and an etched distance between each said feature is variable within the structure, and wherein the ohmic contact layer has a thickness of about 2 microns and an etch depth of about 1.2 microns;
   wherein the features comprise first features, second features, . . . nth features, the features being identical within any one series, the features being distributed along mutually perpendicular first and second directions, the etched distance between the centers of two adjacent features or the inter-reticular distance etched between two adjacent features being variable and the first, second, . . . nth features being of square shape and/or of rectangular shape;
   wherein said features in said first direction are responsive to multiple wavelengths such that the periodic effects in said photodetector are eliminated while the range of detectable wavelengths is expanded to a broader spectral band; and
   wherein said features in said second direction are responsive to multiple wavelengths such that the periodic effects in said photodetector are eliminated while the range of detectable wavelengths is expanded to a broader spectral band.

2. The optical coupling structure as claimed in claim 1, wherein the average of the inter-reticular distances between two adjacent features along the first direction and the average along the second direction are substantially equal to the wavelength of the electromagnetic radiation in the detector medium.

3. The optical coupling structure as claimed in claim 2, wherein the features of square or rectangular shape have constant inter-reticular distances.

4. The optical coupling structure as claimed in claim 3, wherein the coupling surface consists of four series of elementary cells a×a, b×b, a×b, b×a.

5. The optical coupling structure as claimed in claim 4, wherein the fill factor of the cells with the features is constant, the distances between features being variable.

6. The optical coupling structure as claimed in claim 4, wherein the cell fill factor is variable.

7. An electromagnetic wave detector comprising a multiple quantum well structure operating on interband or intersubband transitions by absorption of radiation at a wavelength $\lambda$, and comprising optical coupling means for coupling said radiation, wherein the optical coupling means comprise an optical coupling structure as claimed in claim 1.

8. The electromagnetic wave detector as claimed in claim 7, wherein it comprises a multilayer stack produced on the surface of a substrate, said stack comprising the multiple quantum well structure and external layers, the features being etched within one external layer.

9. The electromagnetic wave detector as claimed in claim 8, wherein the thickness of the first and second features is around $\lambda/4$.

10. The electromagnetic wave detector as claimed in claim 8, wherein the stack of active layers is a stack of semiconductor layers of the doped GaAs or GaAlAs type, the substrate being of the doped or undoped GaAs type.

11. The electromagnetic wave detector as claimed in claim 7, wherein it comprises a substrate that is transparent at the wavelength of the radiation and a layer that is reflective at said wavelength, said reflective layer being on the surface of the features, so as to make the detector operate in reflection.

12. A matrix electromagnetic wave detector, wherein it comprises a matrix of individual detector elements as claimed in claim 7, each individual detector element having a multilayer stack, said stack comprising the multiple quantum well structure and external layers, the features being etched within one external layer, said elements being produced on the surface of a common substrate.

13. A laser source comprising a multiple quantum well structure operating on interband or intersubband transitions at a wavelength $\lambda$, and comprising optical coupling means for coupling said radiation, characterized in that the optical coupling means comprise an optical coupling structure as claimed in claim 1.

14. The electromagnetic wave detector as claimed in claim 9, wherein the stack of active layers is a stack of semiconductor layers of the doped GaAs or GaAlAs type, the substrate being of the doped or undoped GaAs type.

15. The electromagnetic wave detector as claimed in claim 8, wherein it comprises a substrate that is transparent at the wavelength of the radiation and a layer that is reflective at said wavelength, said reflective layer being on the surface of the features, so as to make the detector operate in reflection.

16. The electromagnetic wave detector as claimed in claim 9, wherein it comprises a substrate that is transparent at the wavelength of the radiation and a layer that is reflective at said wavelength, said reflective layer being on the surface of the features, so as to make the detector operate in reflection.

17. A matrix electromagnetic wave detector, wherein it comprises a matrix of individual detector elements as claimed in claim 8, each individual detector element having a multilayer stack, said stack comprising the multiple quantum well structure and external layers, the features being etched within one external layer, said elements being produced on the surface of a common substrate.

18. A matrix electromagnetic wave detector, wherein it comprises a matrix of individual detector elements as claimed in claim 9, each individual detector element having a multilayer stack, said stack comprising the multiple quantum well structure and external layers, the features being etched within one external layer, said elements being produced on the surface of a common substrate.

19. A laser source comprising a multiple quantum well structure operating on interband or intersubband transitions at a wavelength $\lambda$, and comprising optical coupling means for coupling said radiation, wherein the optical coupling means comprise an optical coupling structure as claimed in claim 2.

20. The optical coupling structure as claimed in claim 4, wherein said length a is matched to a first wavelength and said length b is matched to a second wavelength as to obtain an effective coupling structure a predetermined spectral band.

21. The optical coupling structure as claimed in claim 4, wherein for each type cell, said feature is placed at the center of the cell, and the spacing between each said feature is variable within the structure.

* * * * *